(12) United States Patent
Suissa et al.

(10) Patent No.: US 9,413,294 B2
(45) Date of Patent: Aug. 9, 2016

(54) APPARATUS AND METHOD FOR CORRECTING IQ IMBALANCE

(75) Inventors: Udi Suissa, Givataim (IL); Avi Cohen, Kfar Saba (IL)

(73) Assignee: DSP GROUP LTD., Herzelia (IL)

( * ) Notice: Subject to any disclaimer, the term of this patent is extended or adjusted under 35 U.S.C. 154(b) by 0 days.

(21) Appl. No.: 14/129,629

(22) PCT Filed: Jul. 3, 2011

(86) PCT No.: PCT/IL2011/000523
§ 371 (c)(1),
(2), (4) Date: Apr. 3, 2014

(87) PCT Pub. No.: WO2013/005203
PCT Pub. Date: Jan. 10, 2013

(65) Prior Publication Data
US 2014/0204986 A1    Jul. 24, 2014

(51) Int. Cl.
*H04B 1/38*   (2015.01)
*H04L 5/16*   (2006.01)
*H03D 3/00*   (2006.01)
*H04L 27/00*  (2006.01)
*H04L 27/36*  (2006.01)
*H04L 27/38*  (2006.01)

(52) U.S. Cl.
CPC ............ *H03D 3/009* (2013.01); *H04L 27/0014* (2013.01); *H04L 27/364* (2013.01); *H04L 27/38* (2013.01)

(58) Field of Classification Search
CPC ........................................................ H03D 3/009
USPC .......................................................... 375/221
See application file for complete search history.

(56) References Cited

U.S. PATENT DOCUMENTS

| | | | |
|---|---|---|---|
| 7,570,710 B1* | 8/2009 | Fortier et al. ................. | 375/297 |
| 2004/0038649 A1* | 2/2004 | Lin et al. ....................... | 455/130 |
| 2007/0092021 A1* | 4/2007 | Otaka et al. ................... | 375/268 |
| 2009/0010358 A1* | 1/2009 | Jaganathan et al. .......... | 375/296 |
| 2012/0328041 A1* | 12/2012 | Chen ..................... | H04L 27/364 375/285 |
| 2015/0171978 A1* | 6/2015 | Mehrmanesh ..... | H04B 17/0085 375/226 |

* cited by examiner

*Primary Examiner* — Sam K Ahn
*Assistant Examiner* — Fabricio R Murillo Garcia
(74) *Attorney, Agent, or Firm* — Reches Patents (57) ABSTRACT

The subject matter discloses an apparatus residing within an RF chip, comprising:

a detection unit for detecting IQ mismatch in an IQ signal; an analog calibration module comprising a first analog calibration mechanism for calibrating IQ mismatch in the phase component and a second analog calibration mechanism for calibrating IQ mismatch in the amplitude component; and a control unit for determining a calibration sequence of the IQ signal.

11 Claims, 5 Drawing Sheets

APPARATUS AND METHOD FOR CORRECTING IQ IMBALANCE

FIELD OF THE INVENTION

The subject matter relates generally to transceivers' In-phase and Quadrature signals imbalance (IQ imbalance) and more specifically to a method and circuitry for self-auto correction of transceivers IQ imbalance.

BACKGROUND OF THE INVENTION

A typical modern wireless communication transceiver is comprised of an IQ modulation transmitter and a quadrature receiver. The receiver includes a down-converter stage to translate the input Radio Frequency (RF) carrier signal to an Intermediate Frequency (IF) signal. The transmitter includes an up-converter stage to translate the IF input signal to RF output signal.

Specifically, a quadrature receiver implements complex down-conversion, whereby an RF signal is split and multiplied by a Local Oscillator (LO) and a quadrature version of the LO. In effect, in one branch of the receiver the input signal is multiplied by a cosine waveform at the LO frequency, while in the other branch the input signal is multiplied by a sine waveform at the LO frequency. The resulting outputs are known as in-phase (I) and quadrature (Q) IF components.

An IQ modulation transmitter implements complex up-conversion, whereby IQ IF input signals are multiplied by an LO and a quadrature version of the LO and then summed and amplified. In effect, in one branch of the transmitter the I-input signal is multiplied by a cosine waveform at the LO frequency, while in the other branch the Q-input signal is multiplied by a sine waveform at the LO frequency. The resulting output is an RF modulated signal.

Imperfections in the analog components of the up/down-converters and/or the LO paths and/or the transceiver IF paths can result in imbalances between the I and Q branches, with respect to their relative amplitudes, relative phases or both. Such imbalance is referred to as IQ Imbalance (IQI) which can have significant impact on the performance of a wireless transceiver. This is particularly true in direct-conversion receivers using OFDM modulation with high constellations contemplated for many future applications.

IQ Imbalance may occur when an amplitude and/or phase of I and Q components (of the IF branches or the LO branches) are mismatched. For example, when I and Q branches have phase difference which is not exactly 90° or when I and Q branches have non-equal amplitudes. Analog components that may contribute to the mismatch are mixers, IF amplifiers, IF filters, ADCs, DACs and others.

The IQ imbalance can also be frequency dependent. Such a mismatch is mainly contributed by the IF section.

Realistic values of mismatch (without calibration and with careful design) are 1°-5° in the phase difference and 0.1 dB-0.5 dB in the amplitude or gain difference. These numbers result in 20 dB-40 dB Image Rejection.

IQ imbalance has a direct impact on transmit (Tx) and receive (Rx) EVM and thus on Sensitivity. Usually we will refer to its contribution to the EVM as Image Rejection Ratio (IMR). EVM dependence on additional parameters, like linearity and Integrated Phase Noise emphasizes the impact of IQ imbalance on EVM. IQI is considered to be critical for OFDM modulation especially when a direct conversion receiver is implemented and higher data constellations are used.

Many algorithms for correcting IQ imbalance are implemented fully in Digital domain. Some do the IQ imbalance measurement in the digital domain but do the correction in the analog domain.

SUMMARY

It is an object of the subject matter to disclose an apparatus residing within an RF chip, comprising a detection unit for detecting IQ mismatch in an IQ signal; an analog calibration module comprising a first analog calibration mechanism for calibrating IQ mismatch in the phase component and a second analog calibration mechanism for calibrating IQ mismatch in the amplitude component; a control unit for determining a calibration sequence of the IQ signal.

In some cases, the first analog calibration mechanism comprises an operational amplifier and a plurality of resistors.

In some cases, the first analog calibration mechanism shifts a relative phase between an in-phase component and a quadrature component.

In some cases, the second analog calibration mechanism comprises a dynamic resistor for manipulating the amplitude.

In some cases, the second analog calibration mechanism comprises a digital to analog converter and a transistor for determining a resistance of the dynamic resistor for manipulating the amplitude.

In some cases, the calibration module is configured to operate in predefined mismatch levels of IQ mismatch in the phase component and IQ mismatch in the amplitude component.

In some cases, the apparatus further comprises a calibration crossing mechanism for canceling self mismatch of analog electrical components of the apparatus.

It is another object of the subject matter to disclose a method for correcting an IQ imbalance in a transceiver comprising a transmitting unit and a receiving unit, comprising calibrating the IQ imbalance in the transmitting unit; switching the transceiver into loopback mode; calibrating the IQ imbalance in the receiving unit using a signal received from an output of the transmitter unit.

In some cases, the method further comprises a step of receiving an RF transmitted signal at the transmitter unit.

In some cases, correcting the IQ mismatch in the transmitting unit according to an envelope of the received RF transmitted signal.

In some cases, measuring the power in a frequency double than a frequency of the envelope of the received RF transmitted signal.

In some cases, correcting the IQ mismatch in the receiving signal according to measured power in an image frequency of the signal received from an output of the transmitter unit.

In some cases, correcting the IQ mismatch in the transmitting unit using an analog an analog correction module.

In some cases, the method further comprises a step of performing Automatic gain control on the received IQ signal.

In some cases, calibrating the IQ imbalance comprises steps of:
 calibrating a phase IQ imbalance;
 calibrating a gain IQ imbalance;
 sampling an envelope in an output of the transmitting unit;
 sampling an in-phase (I) component and a quadrature (Q) component of the received IQ signal in an output of the receiving unit.

BRIEF DESCRIPTION OF THE DRAWINGS

Exemplary non-limited embodiments of the disclosed subject matter will be described, with reference to the following description of the embodiments, in conjunction with the figures. The figures are generally not shown to scale and any sizes are only meant to be exemplary and not necessarily limiting. Corresponding or like elements are optionally designated by the same numerals or letters.

DETAILED DESCRIPTION

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical challenge disclosed in the subject matter is to detect the level of IQ mismatch in the phase component and the amplitude component. Another technical challenge is to detect and correct IQ imbalance in an analog domain while the entire correlation and correction is performed within an RF chip. Another technical challenge is to design and implement an efficient IQ imbalance calibration algorithm while taking into account analog circuitry performance and implementation constraints. Another technical challenge is to cancel the self mismatch of electrical components in the RF chip, for example self mismatch of analog to digital converters and a signal generator. When calibrating the IQ imbalance in the analog domain, another technical challenge is to calibrate the phase component and gain component separately.

One technical solution of the disclosed subject matter is an Iterative IQ Imbalance Correction (IQIC) search algorithm that provides optimization of quality versus resource consumption and time. The IQIC search algorithm also provides rough and fine search stages and various options to fasten the sequence. Another technical solution is a design of dedicated analog correction circuits within the RF chip while meeting specific requirements such as resolution, monotonic behavior, gain/phase separation and the like. Another technical solution is providing Automatic Gain Control (AGC) during iterative search to improve the calibration resolution. Another technical solution is providing Compensation of self mismatch of electrical components such as IQ tones generator and other measurement circuits. Another technical solution is calibrating a receiver according to corrections performed on the transmitter and vice versa.

Figure 1A:
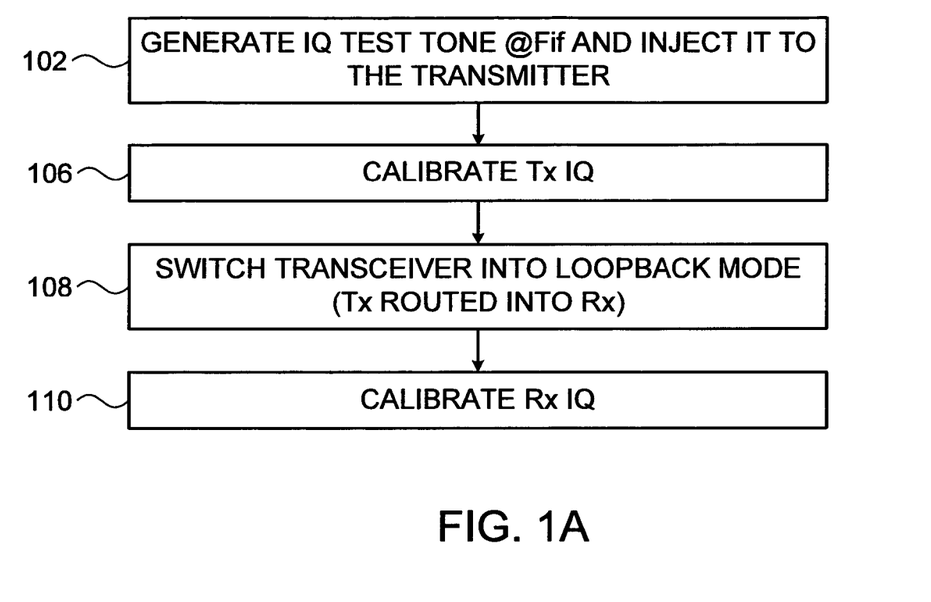
FIG. 1A shows a flow of a method for correcting IQ imbalance, according to some exemplary embodiments of the subject matter.

FIG. 1A shows a flow of a method for calibrating IQ imbalance, according to some exemplary embodiments of the subject matter. In step 102, an IQ tone signal is generated. The IQ signal comprises a quadrature component and an in-phase component. Both the quadrature component and the in-phase component are represented by a gain and a phase. The IQ tone signal may be generated by an IQ generation unit.

In step 106, the IQ mismatch in the transmitting unit is calibrated. Such calibration is described in details in FIG. 1B. After calibrating the IQ mismatch in the transmitting unit, the transceiver is switched into loopback mode, as shown in step 108. Switching the transceiver into loopback mode may be performed using a switch connecting the transmitting unit 250 and the receiving unit 210. Switching the transceiver into loopback mode enables injecting a signal from the output of the transmitting unit 250 into the receiving unit 210. While the signal used as input of the transmitting unit 250 is generated in IF and can be provided from IQ generator 224, the signal used as input of the receiving unit 210 is an RF signal generated by the transmitting unit 250. Calibration of the receiving unit 210 is performed in step 110 using the signal received from the transmitting unit 250.

Figure 1B:
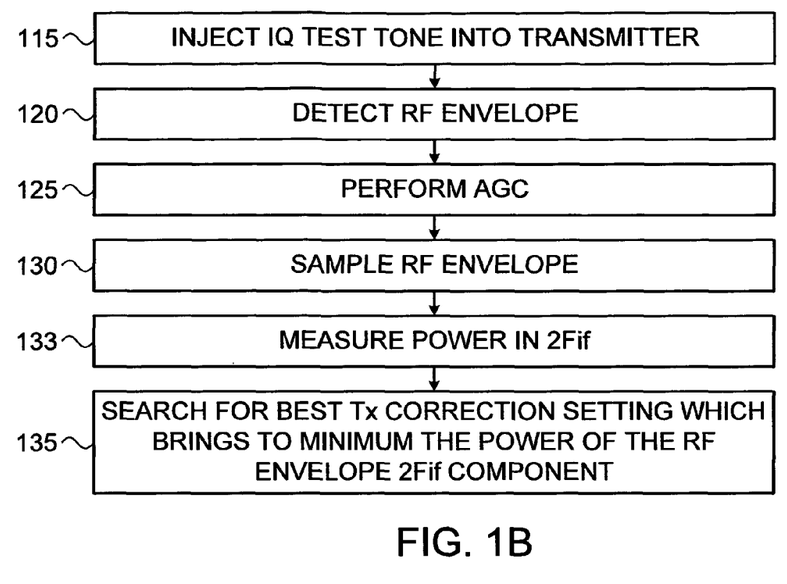
FIG. 1B shows a flow of a method for correcting IQ imbalance in the transmitting unit, according to some exemplary embodiments of the subject matter.

FIG. 1B shows a method for calibrating IQ imbalance in the transmitting unit, according to some exemplary embodiments of the subject matter. In step 115, a signal is injected to the transmitting unit from the IQ generator 224. The injected signal is of IF frequency. In step 120, the envelope of the received signal is detected. The envelope represents the IQ mismatch of the received signal. In step 125, Automatic Gain Control (AGC) is performed on the envelope. The AGC increases the resolution of the envelope and improves accuracy when correcting IQ mismatch.

After performing AGC, the envelope is sampled as shown in step 130. The envelope is sampled in a continuous manner, including after every change of the received signal. Each change of the received signal is performed in step 135. Correction may be performed after measuring the power of the received signal in a frequency double than the frequency of the received IQ signal as shown in step 133.

The correction of step 135 includes changing, initially, the gain ratio between the in-phase component and the quadrature component of the sampled envelope. After each change, the power of the envelope is detected to determine whether the change increased or decreased the IQ mismatch. In case the change reduced the IQ mismatch, another change in the ratio is generated towards the same direction. When changing the ratio does not reduce the IQ mismatch, the gain ratio is locked and the same process is applied on the phase.

After reaching a point when changing the gain and the phase does not reduce the IQ mismatch, the method may include a step of increasing the resolution level of correction. For example, if the correction was of every 0.3 dB in the first round, the corrections in the second round will be of every 0.1 dB. Increasing the resolution level of correction may comprise a step of performing another AGC for improving the resolution of the envelope.

Figure 5:
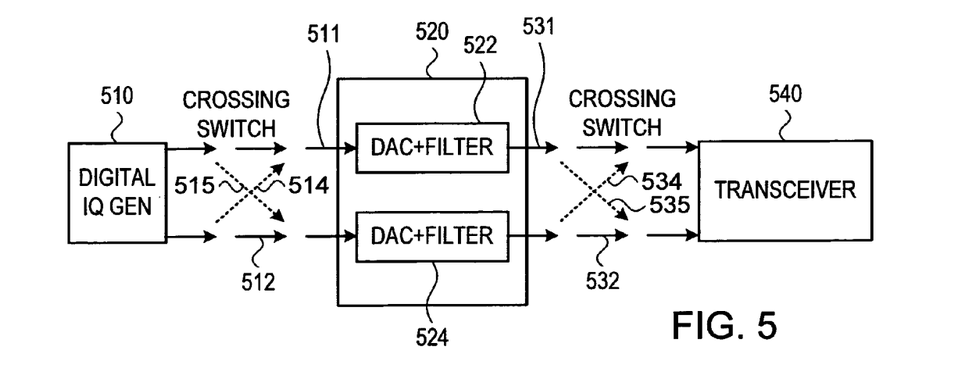

Correcting the IQ mismatch may also include a second full calibration sequence in which the IQ tone signal is transferred via the crossing correction mechanism shown in FIG. 5. The crossing correction mechanism provides for compensating the IQ mismatch of internal components, such as the IQ generator 224 and ADC 235.

Figure 1C:
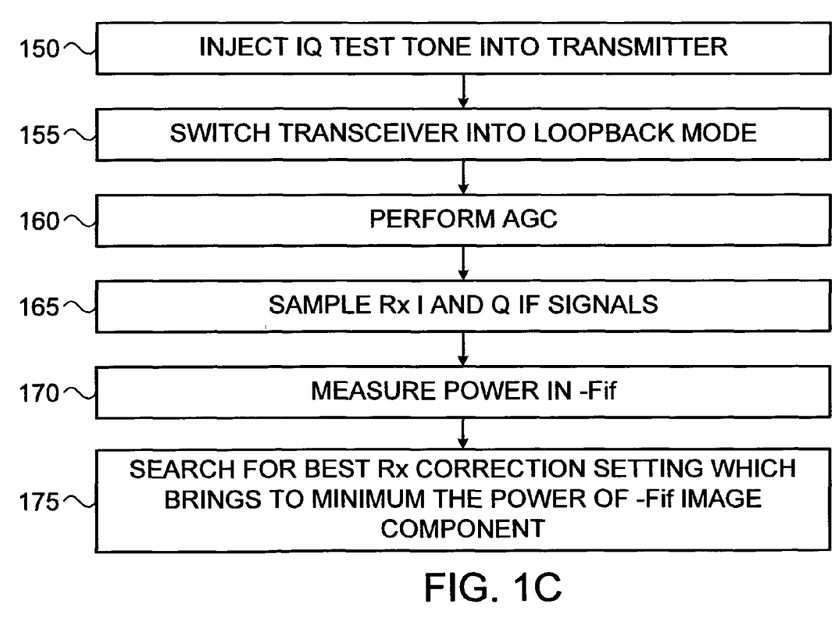
FIG. 1C shows a flow of a method for correcting IQ imbalance in the receiving unit, according to some exemplary embodiments of the subject matter.

FIG. 1C shows a method for correcting IQ imbalance in the receiving unit, according to some exemplary embodiments of the subject matter. In step 150, a signal is injected to the transmitting unit from the IQ generator 224. The injected signal is of IF frequency. In step 155, the transceiver is switched into loopback mode. Switching the transceiver into loopback mode may be performed using a switch connecting the transmitting unit 250 and the receiving unit 210. Switching the transceiver into loopback mode enables injecting a signal from the output of the transmitting unit 250 into the receiving unit 210.

In step 160, Automatic Gain Control (AGC) is performed on the received signal. The signal received in step 150 is an IQ signal comprising an in-phase (I) component and a quadrature (Q) component. In step 165, both the in-phase (I) component and the quadrature (Q) component of the received IQ signal is sampled at the receiving unit. In step 170, the sampled signal is measured in an image frequency. The image frequency is opposite to frequency of the received IQ signal.

In step 175, correction is performed in the receiving unit. The manner of correcting the IQ mismatch is substantially similar to step 135 in which correction is performed in the transmitting unit. The correction includes correcting the phase component separately from the gain component. Only one of the analog phase correction mechanism or the analog gain correction mechanism can be used on a given correction.

In some exemplary embodiments, a codeword representing a required correction is converted to calibration units via an electrical circuitry. Such electrical circuitry comprises a Digital to Analog Converter that receives the codeword. When the calibration is performed in the gain component or the amplitude component, the codeword has a value representing dB units. When the calibration is required in the phase component, the codeword has a value representing degrees. The codeword is converted to analog data by a plurality of switches and controllable inputted current. Such analog data may then be received at the calibration module that calibrates the IQ mismatch in both phase component and gain component. The value of calibration may be a function of the value in the received codeword.

The calibrations in the phase component or the gain component may be performed by the phase calibration mechanism or by the gain calibration mechanism. The level of calibration of the IQ signal may influence the resistance or voltage levels used in the phase calibration mechanism or by the gain calibration mechanism. For example, higher level of calibration requires a dynamic resistor of less resistance, as disclosed below. The calibration of either the phase correction mechanism or the gain correction mechanism may refer to the ratio between the phase or the gain of the in-phase component or the quadrature component.

Figure 2:
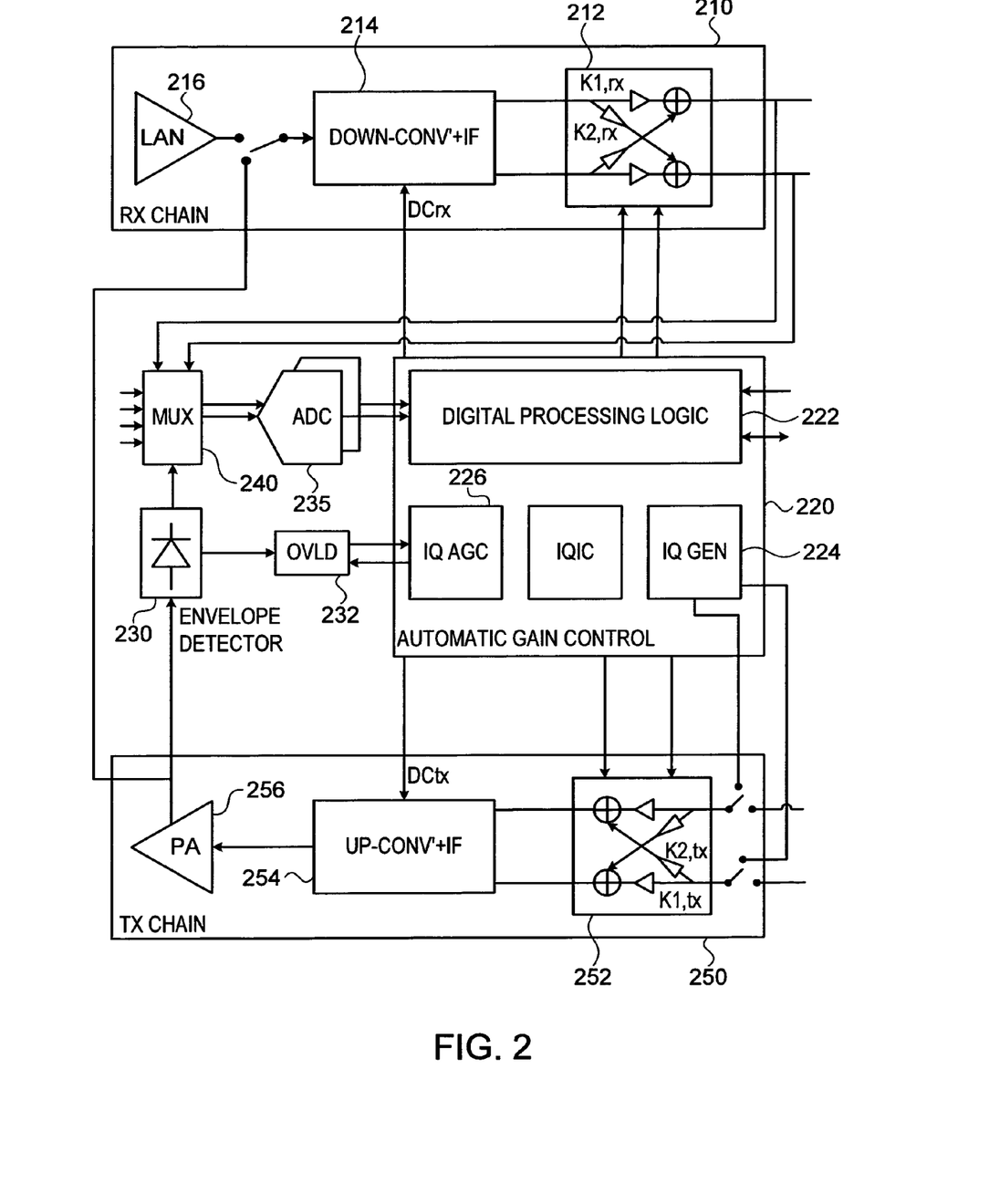
FIG. 2 shows a system for correcting IQ imbalance, according to some exemplary embodiments of the subject matter.

FIG. 2 shows a system for calibration IQ imbalance, according to some exemplary embodiments of the subject matter. The system comprises a receiving unit 210, a processing unit 220 and a transmitting unit 250.

The receiving unit 210 comprises a low-noise amplifier 216. The signal received at the low-noise amplifier 216 passes through a switch to a down converter and filtering unit 214 and then to a calibration module 212. The down converter and filtering unit 214 comprises a mixer which down converts the received RF signal to IF domain followed by an IF chain. The IF chain comprises an IF amplifier and a selectivity filter. The calibration module 212 comprises a first calibration mechanism (such as 300 of FIG. 3) for calibrating IQ mismatch in the amplitude component and a second calibration mechanism (such as 400 of FIG. 4) for calibrating IQ mismatch in the phase component. In some exemplary cases, the first calibration mechanism and the second calibration mechanism operate in the analog domain. The calibration module 212 is connected to elements of the processing unit 220. For example, to digital processing logic unit 222 that detects IQ mismatch. Such detection may be a function of both IQ mismatch of a phase component and IQ mismatch in the gain component in the IQ signal received at the receiving unit 210.

The processing unit 220 comprises the digital processing logic unit 222. The processing unit 220 may also comprise a multiplexer 240. The multiplexer 240 may be connected to an ADC unit 235. The multiplexer 240 Selects inputs into the ADC unit 235 according to calibration mode. The multiplexer 240 may select one of a detector path or receive path. During IQ calibration in the transmission unit 250, the multiplexer 240 routes the output of an envelope detector 230 into the ADC. During IQ calibration in the receiving unit 210, the multiplexer 240 routes the received in-phase component and quadrature component of the IF signals into the ADC unit 235. The envelope detector 230 detects the envelope of the RF signal in the transmitting unit 250. The processing unit 220 may also comprise an overload unit 232 for Identifying saturation of an output signal of the envelope detector 230.

The transmitting unit 250 comprises a power amplifier 256, an up-conversion unit with filter 254 and a correction module 252. The calibration module 252 is equivalent to the calibration module 212 and comprises a gain calibration mechanism and a phase calibration mechanism for calibrating IQ mismatch in the gain component and phase component respectively. The calibration module 252 receives an IQ signal from an IQ generator 224 that generates IQ signals. The signal calibrated by the calibration module 252 may pass through the up-conversion unit with filter 254 and the power amplifier 256 to the envelope detector 230 of the processing unit 220. The up-conversion unit with filter 254 Up converts the IF IQ signal to RF domain after IF filtering. The envelope detector provides a signal to the multiplexer 240 according to the quality of the IQ signal outputted from the correction module 252.

Figure 3:
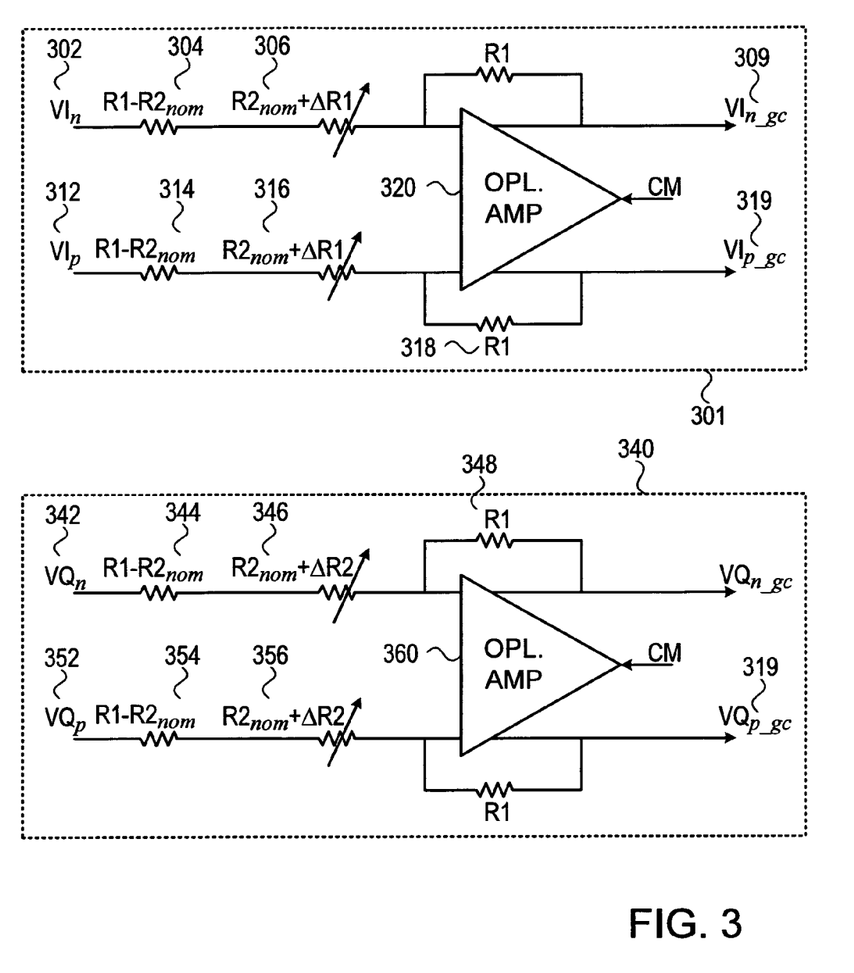
FIG. 3 shows a gain correction mechanism, according to some exemplary embodiments of the subject matter.

FIG. 3 shows a gain calibration module, according to some exemplary embodiments of the subject matter. In some exemplary cases, the gain calibration mechanism operates in the analog domain. The gain calibration mechanism 300 comprises an in-phase calibration unit 301 for calibrating IQ mismatch in the in-phase gain component and a quadrature calibration unit 340 for calibrating IQ mismatch in the quadrature gain component. The gain calibration mechanism 300 of the exemplary embodiment comprises two calibration units of a substantially similar functionality.

The in-phase calibration unit 301 receives two signals as input, positive in-phase signal 302 and negative in-phase signal 312. The quadrature calibration unit 340 receives two signals as input, positive quadrature signal 342 and negative quadrature signal 352. When received at the in-phase calibration unit 301 or at the quadrature calibration unit 340, the signals 302, 312, 342 and 352 pass through an electrical circuit that enables controlling the value in the output of the in-phase calibration unit 301 and the output of the quadrature calibration unit 340. Such electrical circuit may comprise a static resistor and dynamic resistor. The positive in-phase signal 302 is transferred through static resistor 304 and dynamic resistor 306. Similarly, the negative in-phase signal 312 is transferred through static resistor 314 and dynamic resistor 316, the positive quadrature signal 342 is transferred through static resistor 344 and dynamic resistor 346 and the negative quadrature signal 352 is transferred through static resistor 354 and dynamic resistor 356

In some cases, the resistance of the dynamic resistor 306 is controlled by a control element. Such control element may comprise a Digital to Analog converter that changes voltage values and manipulates the resistance of the dynamic resistor 306 accordingly. The control element may be any electrical element that enables changing the value of the inputted signal in an automatic manner as desired by a person skilled in the art. The control element may be connected to a storage unit for storing a set of rules and conditions used to manipulate the inputted signals 302, 312, 342 and 352. For example, such manipulation may be of a higher distinction in a first iteration and delicate changes in other iterations. The ratio between the inputted signal and the outputted signal may be a function of the resistance determined by the control element. Such ratio may be, for example, (R1+R2)/R2, where R1 refers to the static resistor, such as 304, and R2 refers to the dynamic resistor, such as 306.

The operational amplifier 320 receives a negative input signal 302 and a positive input signal 312 and the operational amplifier 360 receives a negative input signal 302 and a positive input signal 312. In some cases, the operational amplifiers 320, 360 are connected in a negative feedback configuration to reduce the input difference signal.

In some cases, the in-phase calibration unit 301 and the quadrature calibration unit 340 change the ratio between the gains of the in-phase signals 302, 312 and the gains of the quadrature signals 342, 352. For example, the in-phase correcting unit 301 may receive inputted in-phase signals 302, 312 having the same gain as the inputted quadrature signals 342, 352. The control elements that control the resistance of the dynamic resistors 306, 316, 346, 356 provide that outputted in-phase signals 309, 319 have a gain different from the gain of outputted quadrature signals 349, 359. For example, the gain of the outputted in-phase signals 309, 319 may be 10 percent higher or 10 percent lower than the gain of outputted quadrature signals 349, 359. Similarly, the difference between the gains of the outputted in-phase signals 309, 319 and the outputted quadrature signals 349, 359 may be measured by dB units, such as a difference of 0.1 dB. In some other cases, the inputted signals may have different gains and the outputted signals may have equal gains. The change of the difference or ratio of the gain between the inputted and outputted in-phase signals and quadrature signals may be determined by a control element. Such change may be higher in the first iteration and lower in further iterations. Such change may end when the total noise resulting from IQ imbalance is lower than a predefined threshold, such as 0.1 dB.

Figure 4:
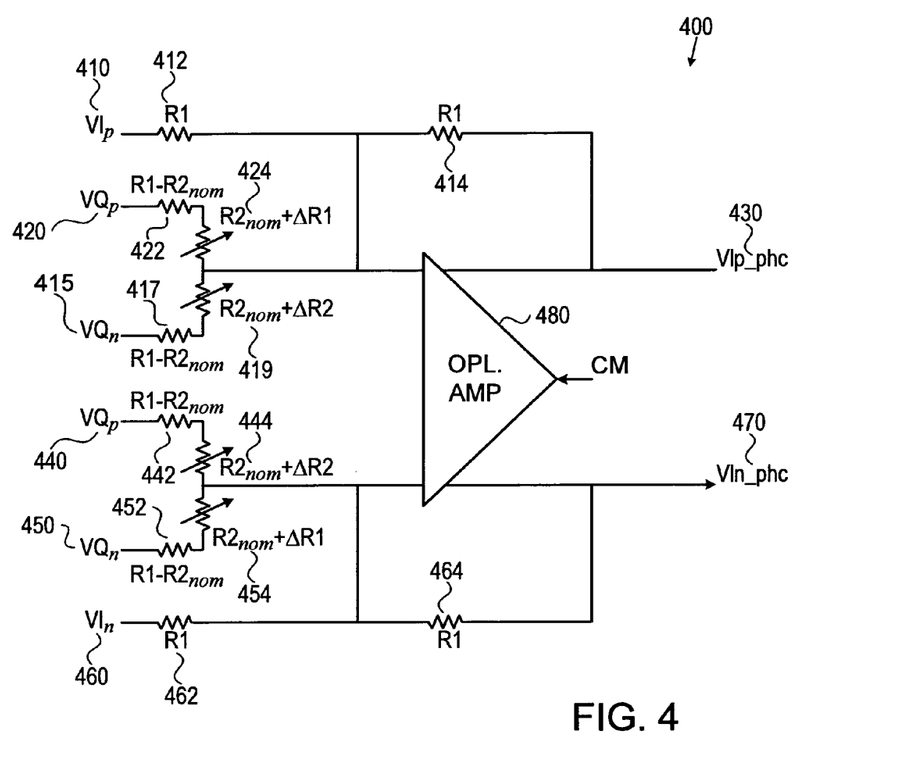
FIG. 4 shows a phase correction mechanism, according to some exemplary embodiments of the subject matter; and, FIG. 5 shows the concept of handling the calibration mechanism mismatch, according to some exemplary embodiments of the subject matter.

FIG. 4 shows a phase calibration mechanism, according to some exemplary embodiments of the subject matter. In some exemplary cases, the phase calibration mechanism operates in the analog domain. The phase calibration mechanism 400 receives four signals, in an input similar to the gain calibration mechanism 300 of FIG. 3. The phase calibration mechanism 400 receives a positive in-phase signal 410 that passes through two static resistors 412, 414. The phase calibration mechanism 400 further receives a positive quadrature signal 420 that passes through static resistor 422 and dynamic resistor 424 before entering an operational amplifier 480. A negative quadrature signal 415 also passes through static resistor 417 and dynamic resistor 419 before entering the operational amplifier 480. The output of the operational amplifier 480 is outputted positive phase corrected signal 430. The calibration of the phase may be represented as injection of a minor quadrature signal into a major in-phase signal or vice-versa. For example, when the major in-phase signal is represented by A cos(wt) and the minor quadrature signal is represented by B sin(wt), the summation of the two signals provides an expression comprising D cos(wt−α), where α is the change in the phase.

Similar to the above, the phase calibration mechanism 400 receives a negative in-phase signal 460 that passes through two static resistors 462, 464 with the same resistance. The phase calibration mechanism 400 further receives a negative quadrature signal 450 that passes through static resistor 452 and dynamic resistor 454 before entering the operational amplifier 480. A positive quadrature signal 440 passes through static resistor 442 and dynamic resistor 444 before entering the operational amplifier 480. The output of the operational amplifier 480 is outputted negative phase corrected signal 470.

FIG. 5 shows a crossing calibration mechanism, according to some exemplary embodiments of the subject matter. The crossing calibration mechanism comprises a digital IQ generator 510. The IQ generator 510 generates a digital IQ signal having no mismatch. The digital signal from the IQ generator 510 is transmitted to a transceiver 540 via a digital to analog and filtering units 522, 524. The digital to analog and filtering units 522, 524 cause mismatch in the IQ signals. The crossing calibration mechanism enables detection and correction of the mismatch caused by the digital to analog and filtering units 522, 524.

The I component is first transmitted from the IQ generator 510 via channel 511 to the digital to analog and filtering unit 522 and then via channel 531 to the transceiver 540. The mismatch caused by the digital to analog and filtering unit 522 to the I component is then stored. Similarly, the Q component is transmitted from the IQ generator 510 via channel 512 to the digital to analog and filtering unit 524 and then via channel 532 to the transceiver 540. In the second iteration, the I component is transmitted from the IQ generator 510 via channel 515 to the digital to analog and filtering unit 524 and then via channel 534 to the transceiver 540. The mismatch caused by the digital to analog and filtering unit 524 to the I component is stored. Similarly, the Q component is transmitted from the IQ generator 510 via channel 514 to the digital to analog and filtering unit 522 and then via channel 535 to the transceiver 540. A similar crossing mechanism is implemented in the receive path, before the ADCs 235 and in the digital processing logic 222, enabling detection and correction of the mismatch caused by the analog to digital converters.

It is one technical effect of the subject matter to enable IQ mismatch calibration within the RF chip only, without regard to another chip. It is another technical effect to cancel self mismatch of electrical components within the RF chip, such as analog to digital converters. It is another technical effect of the subject matter to use loopback mode in order to use the output of the transmitter as the signal used by the receiving unit for calibration. It is another technical effect of the subject matter to disclose a search method used to reach an optimal calibration using analog components in the RF chip.

The flowchart and block diagrams in the Figures illustrate the architecture, functionality, and operation of possible implementations of systems, methods and computer program products according to various embodiments of the present subject matter. In this regard, each block in the flowchart or block diagrams may represent a module, segment, or portion of program code, which comprises one or more executable instructions for implementing the specified logical function (s). It should also be noted that, in some embodiments implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present subject matter may take the form of a computer program product embodied in any tangible medium of expression having computer-usable program code embodied in the medium.
Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present subject matter has been presented for purposes of illustration and description, but is not intended to be exhaustive or limited to the subject matter in the form disclosed. Many modifications and variations will be apparent to those of ordinary skill in the art without departing from the scope and spirit of the subject matter. The embodiment was chosen and described in order to best explain the principles of the subject matter and the practical application, and to enable others of ordinary skill in the art to understand the subject matter for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the subject matter. In addition, many modifications may be made to adapt a particular situation or material to the teachings without departing from the essential scope thereof. Therefore, it is intended that the disclosed subject matter not be limited to the particular embodiment disclosed as the best mode contemplated for carrying out this subject matter, but only by the claims that follow.

What is claimed is:

1. An apparatus residing within a radio frequency (RF) chip, comprising:
   a transmitter;
   a receiver;
   a processing unit comprising an automatic gain control (AGC) that is configured to detect an in-phase and quadrature (IQ) mismatch of a phase component of an IQ signal and an IQ mismatch of an amplitude component of the IQ signal;
   an analog calibration module, included in the receiver, comprising a first analog calibration mechanism for calibrating the IQ mismatch in the phase component of the IQ signal and a second analog calibration mechanism for calibrating the IQ mismatch in the amplitude component of the IQ signal;

wherein the processing unit is also configured to determine a calibration sequence of the IQ signal;

wherein during a calibration of an IQ imbalance in the receiver, the processing unit is further configured to:

generate multiple test signals that differ from each other in a first phase and in a second phase that follows the first phase; wherein differences between consecutive test signals of the first phase are larger than differences between consecutive test signals of the second phase;

inject the multiple test signals, at different points in time, to the transmitter; wherein the transmitter outputs the multiple IQ signals in response to the injection of the multiple test signals;

wherein the receiver is configured to:

receive a RF signal output from the transmitter based on the output multiple IQ signals;

down-convert the received RF signal into an intermediate frequency (IF) signal, provide the IF signal to the analog calibration module; and output a receiver output signal, from the analog calibration module based on the IF signal, that forms the IQ signal.

2. The apparatus according to claim 1, wherein the first analog calibration mechanism comprises an operational amplifier and a plurality of resistors.

3. The apparatus according to claim 1, wherein the first analog calibration mechanism shifts a relative phase between an in-phase component and a quadrature component.

4. The apparatus according to claim 1, wherein the second analog calibration mechanism comprises a dynamic resistor for manipulating the amplitude.

5. The apparatus according to claim 4, wherein the second analog calibration mechanism comprises a digital to analog converter and a transistor for determining a resistance of the dynamic resistor for manipulating the amplitude.

6. The apparatus according to claim 1, wherein the analog calibration module is configured to operate in predefined mismatch levels of IQ mismatch in the phase component and IQ mismatch in the amplitude component.

7. The apparatus according to claim 1, further comprises a calibration crossing mechanism for canceling self mismatch of analog electrical components of the apparatus.

8. The apparatus according to claim 1, wherein the multiple test signals has a first IF frequency; wherein the processing unit is configured to receive the IQ signal and to measure power at a second IF frequency that is double than the first IF frequency.

9. The apparatus according to claim 1, wherein the processing unit is configured to detect an envelope of the IQ signal and to apply the AGC on the envelope.

10. The apparatus according to claim 1, wherein the multiple test signals are of a first frequency and wherein the processing unit is configured to measure power at an image frequency that is opposite to the first frequency.

11. The apparatus according to claim 1, comprising an additional analog calibration module; wherein the apparatus is configured to perform, while using the analog calibration module, a calibration of an IQ imbalance in the transmitter, and is configured to perform, while using the additional analog calibration module, a calibration of an IQ imbalance in the receiver.

* * * * *